United States Patent
Vlcek et al.

(10) Patent No.: US 9,352,342 B2
(45) Date of Patent: May 31, 2016

(54) METHOD OF MAKING A CIG TARGET BY COLD SPRAYING

(71) Applicant: HANERGY HOLDING GROUP LTD., Beijing (CN)

(72) Inventors: Johannes Vlcek, San Francisco, CA (US); Daniel R. Juliano, Santa Clara, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 171 days.

(21) Appl. No.: 14/242,245

(22) Filed: Apr. 1, 2014

(65) Prior Publication Data

US 2014/0209704 A1    Jul. 31, 2014

Related U.S. Application Data

(62) Division of application No. 12/907,169, filed on Oct. 19, 2010, now Pat. No. 8,709,335.

(60) Provisional application No. 61/272,679, filed on Oct. 20, 2009.

(51) Int. Cl.
| | |
|---|---|
| *B05B 7/16* | (2006.01) |
| *C23C 14/34* | (2006.01) |
| *C23C 24/04* | (2006.01) |
| *C22C 1/04* | (2006.01) |

(52) U.S. Cl.
CPC .............. *B05B 7/1626* (2013.01); *C22C 1/0425* (2013.01); *C23C 14/3414* (2013.01); *C23C 24/04* (2013.01)

(58) Field of Classification Search
CPC ...... B05B 7/16; B05B 7/1626; C22C 1/0425; C23C 24/04; C23C 14/3413
See application file for complete search history.

(56) References Cited

U.S. PATENT DOCUMENTS

| | | |
|---|---|---|
| 3,902,544 A | 9/1975 | Flemings et al. |
| 3,948,650 A | 4/1976 | Flemings et al. |
| 4,089,680 A | 5/1978 | Flemings et al. |
| 4,103,730 A | 8/1978 | Dussart |
| 4,150,712 A | 4/1979 | Dussart |

(Continued)

FOREIGN PATENT DOCUMENTS

| | | |
|---|---|---|
| DE | 69835851 T2 | 4/2007 |
| EP | 881695 A2 | 12/1998 |

(Continued)

OTHER PUBLICATIONS

Atkinson, Helen, "Stirring Metals", Ingenia, Mar. 2006, 26:19-23.

(Continued)

*Primary Examiner* — Hieu T Vo
(74) *Attorney, Agent, or Firm* — The Marbury Law Group PLLC

(57) ABSTRACT

A method of making a sputtering target includes providing a backing structure, and forming a copper indium gallium sputtering target material on the backing structure by cold spraying. The step of cold spraying includes spraying a powder comprising copper, indium and gallium in a process gas stream, and at least one of an average particle size of the powder is at least 35 μm, a velocity of the process gas stream is at least 150 m/s, or a process gas pressure is 20 bar or less.

8 Claims, 11 Drawing Sheets

(56) References Cited

U.S. PATENT DOCUMENTS

| | | |
|---|---|---|
| 4,178,979 A | 12/1979 | Birat et al. |
| 4,200,137 A | 4/1980 | Zavaras et al. |
| 4,229,210 A | 10/1980 | Winter et al. |
| 4,356,073 A | 10/1982 | McKelvey |
| 5,302,414 A | 4/1994 | Alkhimov et al. |
| 5,343,926 A | 9/1994 | Cheskis et al. |
| 5,401,539 A | 3/1995 | Coombs et al. |
| 5,435,965 A | 7/1995 | Mashima et al. |
| 5,522,535 A | 6/1996 | Ivanov et al. |
| 5,626,688 A | 5/1997 | Probst et al. |
| 5,699,850 A | 12/1997 | Beitelman et al. |
| 5,814,195 A | 9/1998 | Lehan et al. |
| 5,904,966 A | 5/1999 | Lippens |
| 6,020,556 A | 2/2000 | Inaba et al. |
| 6,070,643 A | 6/2000 | Colvin |
| 6,283,386 B1 | 9/2001 | Van Steenkiste et al. |
| 6,310,281 B1 | 10/2001 | Wendt et al. |
| 6,372,538 B1 | 4/2002 | Wendt et al. |
| 6,478,842 B1 | 11/2002 | Gressel et al. |
| 6,500,733 B1 | 12/2002 | Stanbery |
| 6,525,264 B2 | 2/2003 | Ouchida et al. |
| 6,559,372 B2 | 5/2003 | Stanbery |
| 6,593,213 B2 | 7/2003 | Stanbery |
| 6,690,041 B2 | 2/2004 | Armstrong et al. |
| 6,722,584 B2 | 4/2004 | Kay et al. |
| 6,736,986 B2 | 5/2004 | Stanbery |
| 6,739,384 B2 | 5/2004 | Schoen et al. |
| 6,750,394 B2 | 6/2004 | Yamamoto et al. |
| 6,787,692 B2 | 9/2004 | Wada et al. |
| 6,797,874 B2 | 9/2004 | Stanbery |
| 6,822,158 B2 | 11/2004 | Ouchida et al. |
| 6,852,920 B2 | 2/2005 | Sager et al. |
| 6,878,612 B2 | 4/2005 | Nagao et al. |
| 6,881,647 B2 | 4/2005 | Stanbery |
| 6,936,761 B2 | 8/2005 | Pichler |
| 6,987,071 B1 | 1/2006 | Bollman et al. |
| 7,045,205 B1 | 5/2006 | Sager |
| 7,115,304 B2 | 10/2006 | Roscheisen et al. |
| 7,122,392 B2 | 10/2006 | Morse |
| 7,122,398 B1 | 10/2006 | Pichler |
| 7,141,449 B2 | 11/2006 | Shiozaki |
| 7,148,123 B2 | 12/2006 | Stanbery |
| 7,163,608 B2 | 1/2007 | Stanbery |
| 7,194,197 B1 | 3/2007 | Wendt et al. |
| 7,196,262 B2 | 3/2007 | Gronet |
| 7,227,066 B1 | 6/2007 | Roscheisen et al. |
| 7,235,736 B1 | 6/2007 | Buller et al. |
| 7,247,346 B1 | 7/2007 | Sager et al. |
| 7,253,017 B1 | 8/2007 | Roscheisen et al. |
| 7,259,322 B2 | 8/2007 | Gronet |
| 7,262,392 B1 | 8/2007 | Miller |
| 7,267,724 B2 | 9/2007 | Tanaka et al. |
| 7,271,333 B2 | 9/2007 | Fabick et al. |
| 7,291,782 B2 | 11/2007 | Sager et al. |
| 7,306,823 B2 | 12/2007 | Sager et al. |
| 7,319,190 B2 | 1/2008 | Tuttle |
| 7,374,963 B2 | 5/2008 | Basol |
| 7,544,884 B2 | 6/2009 | Hollars |
| 7,637,441 B2 | 12/2009 | Heinrich et al. |
| 7,785,921 B1 | 8/2010 | Juliano et al. |
| 7,833,821 B2 | 11/2010 | Basol |
| 8,709,335 B1 | 4/2014 | Vlcek et al. |
| 9,095,858 B2 * | 8/2015 | Fukanuma ............... B05B 7/14 239/19 |
| 2002/0033135 A1 | 3/2002 | Kay et al. |
| 2005/0109392 A1 | 5/2005 | Hollars |
| 2007/0074969 A1 | 4/2007 | Simpson et al. |
| 2007/0093059 A1 | 4/2007 | Basol |
| 2007/0283996 A1 | 12/2007 | Hachtmann et al. |
| 2007/0283997 A1 | 12/2007 | Hachtmann et al. |
| 2008/0000518 A1 | 1/2008 | Basol |
| 2008/0053519 A1 | 3/2008 | Pearce et al. |
| 2008/0105542 A1 | 5/2008 | Purdy et al. |
| 2008/0121137 A1 | 5/2008 | Van Osten et al. |
| 2008/0142071 A1 | 6/2008 | Dorn et al. |
| 2008/0145692 A1 | 6/2008 | Ziani |
| 2008/0271779 A1 | 11/2008 | Miller et al. |
| 2008/0271781 A1 | 11/2008 | Kushiya et al. |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0199894 A1 | 8/2009 | Hollars et al. |
| 2009/0223556 A1 | 9/2009 | Niesen et al. |
| 2010/0086800 A1 | 4/2010 | Miller et al. |
| 2010/0116341 A1 | 5/2010 | Huang et al. |
| 2010/0133093 A1 | 6/2010 | Juliano et al. |
| 2010/0136242 A1 | 6/2010 | Kay et al. |
| 2010/0212732 A1 | 8/2010 | Schmidt |
| 2010/0212733 A1 | 8/2010 | Schmidt |
| 2011/0089030 A1 | 4/2011 | Juliano et al. |
| 2015/0165457 A1* | 6/2015 | Richter, Jr. ............ B05B 7/1486 239/135 |

FOREIGN PATENT DOCUMENTS

| | | |
|---|---|---|
| JP | 2009-120862 A | 6/2009 |
| JP | 2009-120863 A | 6/2009 |

OTHER PUBLICATIONS

Gabel, Howard, "Tech Spotlight: Kinetic Metallization Compared with HVOF," Adv. Mat. Proc., May 2004, 47-48.

MDA Technology Applications Report, "Coatings" 2004, 2 pages.

Semi-Solid Casting, 10 pages, http://iweb.tms.org/Communities/FTAttachments/Mg%20semi-solid%20%squeeze%20casting.pdf (date unknown).

C. Suryanarayana et al., "Synthesis and Processing of a Cu—In—Ga—Se Sputtering Target," Thin Solid Films 332 (1998) 340-344.

Al-Trans™ Zinc Chromate Replacement, High Frequency Grounding, Inovati.com, 2012.

Al-Trans™ IVD Field Repair, nano Al-Trans® (Al based composite), Inovati.com, 2012.

Al-Trans™ Mild Steel Outside Cabinets, Al-Trans® (Corrosion Protection), Inovati.com, 2012.

Kinetic Metallization of Conformal Antenna and Electronics, KM Conformal Antenna Aperstructures, Inovati.com, 2012.

MCrAlY Coatings, MCrAlY, Inovati.com, 2012.

Kinetic Metallization of High Performance Polymers, High-Performance Paint Alternative, Inovati.com, 2012.

Bodegård et al., "The influence of sodium on the grain structure of $CuInSo_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.

Contreras et al., "On the role of Na and modifications to $Cu(In,Ga)Se_2$ absorber materials using thin-MF (M=Na, K, Cs) precursor layers," 26th IEEE PVSC, Anaheim, California, Sep. 30-Oct. 3, 1997, 359-362.

Department of Defense, Manufacturing Process Standard, Materials Desposition, Cold Spray, MIL-STD-3021, Aug. 4, 2008.

Devaney et al., "Recent improvement in $CuInSe_2$/ZnCdS thin film solar cell efficiency," 18th IEEE Photovoltaic Spec. Conf., 1985, New York, 1733-1734.

Evbuomwan et al., "Concurrent materials and manufacturing process selection in design function deployment," Concurrent Engineering: Research and Applications, Jun. 1995, 3(2):135-144.

Gabel, H. Kinetic Metallization Compared with HVOF, Advanced Materials & Processes, May 2004, ASM International, Metals Park, OH, pp. 47-48.

Granath et al., "Mechanical issues of NO back contracts for $Cu(In,Ga)Se_2$ devices," 13th European Photovoltaic Solar Energy Conference, Proceedings of the International Conference, Nice, France, Oct. 23-27, 1995, Freiesleben et al. Ed., vol. II, 1983-1986.

Hedström et al., "ZnO/CdS/$Cu(In,Ga)Se_2$ thin film solar cells with improved performance," 23rd IEEE Photovoltaic Specialists Conference, Louisville, Kentucky, May 10-14, 1993, 364-371.

(56) References Cited

OTHER PUBLICATIONS

Holz et al., "The effect of substrate impurities on the electronic conductivity in CIS thin films," 12$^{th}$ European Photovoltaic Solar Energy Conference, Proceedings of the International Conference, Amsterdam, The Netherlands, Apr. 11-15, 1994, Hill et al. Ed., vol. II, 1592-1595.

Inovati, Kinetic Metallization™ Equipment, KM Data Sheet, Form MCP4-11, 2011, 1 pg.

Irissou et al., "Review on Cold Spray Process and Technology: Part I—Intellectual Property," J. of Thermal Spray Tech., vol. 17(4), pp. 495-516, Dec. 2008.

Mickelsen et al., "High photocurrent polycrystalline thin-film CdS/CuInSe$_2$ solar cell," Appl. Phys. Lett., Mar. 1, 1980, 36(5):371-373.

Mohamed et al., "Correlation between structure, stress and optical properties in direct current sputtered molybdenum oxide films," Thin Solid Films, 2003, 429:135-143.

Probst et al., "The impact of controlled sodium incorporated on rapid thermal processed Cu(InGa)Se$_2$-thin films and devices," First WCPEC, Hawaii, Dec. 5-9, 2004, 144-147.

Ramanath et al., "Properties of 19.2% Efficiency ZnO/CdS/CuInGaSe$_2$ Thin-film Solar Cells," Progress in Photovoltaics: Research and Applications, 2003, 11:225-230.

Rau et al., "Cu(In,Ga)Se$_2$ solar cells," Clean Electricity From Photovoltaics, Series on Photoconversion of Solar Energy, vol. 1, 2001, Archer et al. Ed., Chapter 7, 277-345.

Robinson, T., "Coatings: Kinetic Metallization," 2004 MDA Technology Applications Report, pp. 36-37, 2004 Missile Defense Agency, Advanced Applications Program, Reprint.

Rudmann et al., "Effects of NaF coevaporation on structural properties of Cu(In,Ga)Se$_2$ thin films," Thin Solid Films, 2003, 431-432:37-40.

Sakurai et al,. "Properties of Cu(In,Ga)Se2:Fe Thin Films for Solar Cells," Mater. Res. Soc. Symp. Proc., 2005, 865:F14.12.1-F.14.12.5.

Scofield et al., "Sodium diffusion, selenization, and microstructural effects associated with various molybdenum back contact layers for Cis-based solar cells," Proc. of the 24$^{th}$ IEEE Photovoltaic Specialists Conference, New York, 1995, 164-167.

So et al., "Properties of Reactively Sputtered Mo$_{1-x}$O$_x$ Films," Appl. Phys. A, 1988, 45:265-270.

Sputtering Materials, Inc., www.sputteringmaterials.com/solar-products.html, "CIG and CIGS Products," Dec. 14, 2011, 1pg.

Stolt et al., "ZnO/CdS/CuInSe$_2$ thin-film solar cells with improved performance," Appl. Phys. Lett., Feb. 8, 1993, 62(6):597-599.

Tapphorn et al., "Kinetic Metallization: Application of Oxidation/Corrosion Resistant Coatings to Rocket Engine Combustion Chamber Liners," AeroMat 2004, Seattle, WA, Jun. 7-10, 2004.

Tapphorn et al., "Kinetic Metallization: Application of Alternative Sacrificial Anodic Coatings for Landing Gear and Aerospace Components," AeroMat 2004, Seattle, WA, Jun. 10, 2004.

Tapphorn et al., "Kinetic Metallization: Joining and Repair of Titanium Aircraft Structures," AeroMat 2004, Seattle, WA, Jun. 9, 2004.

Tapphorn et al., "Kinetic Metallization: Application of Alternative Wear-Resistant Metallic Coatings for Landing Gear and Aerospace Components," AeroMat 2004, Seattle, WA, Jun. 10, 2004.

WC-Co Hard Chrome Replacement, Tungsten Carbide-Cobalt (WC-Co), Inovati.com, 2012.

Windischmann, Henry, "Intrinsic Stress in Sputter-Deposited Thin Films," Critical Reviews in Solid State and Materials Science, 1992, 17(6):547-596.

Yun et al., "Fabrication of CIGS solar cells with a Na-doped Mo layer on a Na-free substrate," Thin Solid Films, 2007, 515:5876-5879.

Centerline®, SST™ Cold Spray Systems, Introducing the SST Series EP Cold Spray System, supersonicspray.com, Supersonic Spray Technologies Division, Copyright 2011, CenterLine (Windsor) Limited, 1 pg.

\* cited by examiner

METHOD OF MAKING A CIG TARGET BY COLD SPRAYING

BACKGROUND

The present invention is directed to a method of making a sputtering target and target materials made by a cold spraying method.

Sputtering techniques are useful in various ways, such as deposition processes used in the fabrication of various products. A component of such sputtering techniques is a sputtering target. In such deposition techniques, the material of the sputtering target is deposited onto a substrate.

SUMMARY

One embodiment of the invention provides a method of making a sputtering target, comprising providing a backing structure, and forming a copper indium gallium sputtering target material on the backing structure by cold spraying. The step of cold spraying comprising spraying a powder comprising copper, indium and gallium in a process gas stream, and at least one of an average particle size of the powder is at least 35 µm, a velocity of the process gas stream is at least 150 m/s, or a process gas pressure is 20 bar or less.

Another embodiment of the invention provides a cold spray deposition system, comprising a powder feed unit, a spray gun, a powder feed line operatively connecting the powder feed unit to the spray gun, a nozzle operatively connected to the spray gun, the nozzle comprising a converging bore in an inlet portion and a straight or diverging bore in an outlet portion, a process gas supply conduit operatively connected to the spray gun, a process gas heater positioned to heat the process gas in the process gas supply conduit. The system further comprises at least one of: (a) the nozzle comprises the straight bore having a substantially constant diameter in the outlet portion, (b) the powder feed line extends into the outlet portion of the nozzle, and/or (c) the nozzle comprises the converging bore in the inlet portion, the diverging bore in the outlet portion, and a throat portion located between the inlet and the outlet portions, the throat portion having a substantially constant inner diameter bore and a predetermined length.

DESCRIPTION OF THE EMBODIMENTS

Figure 1:
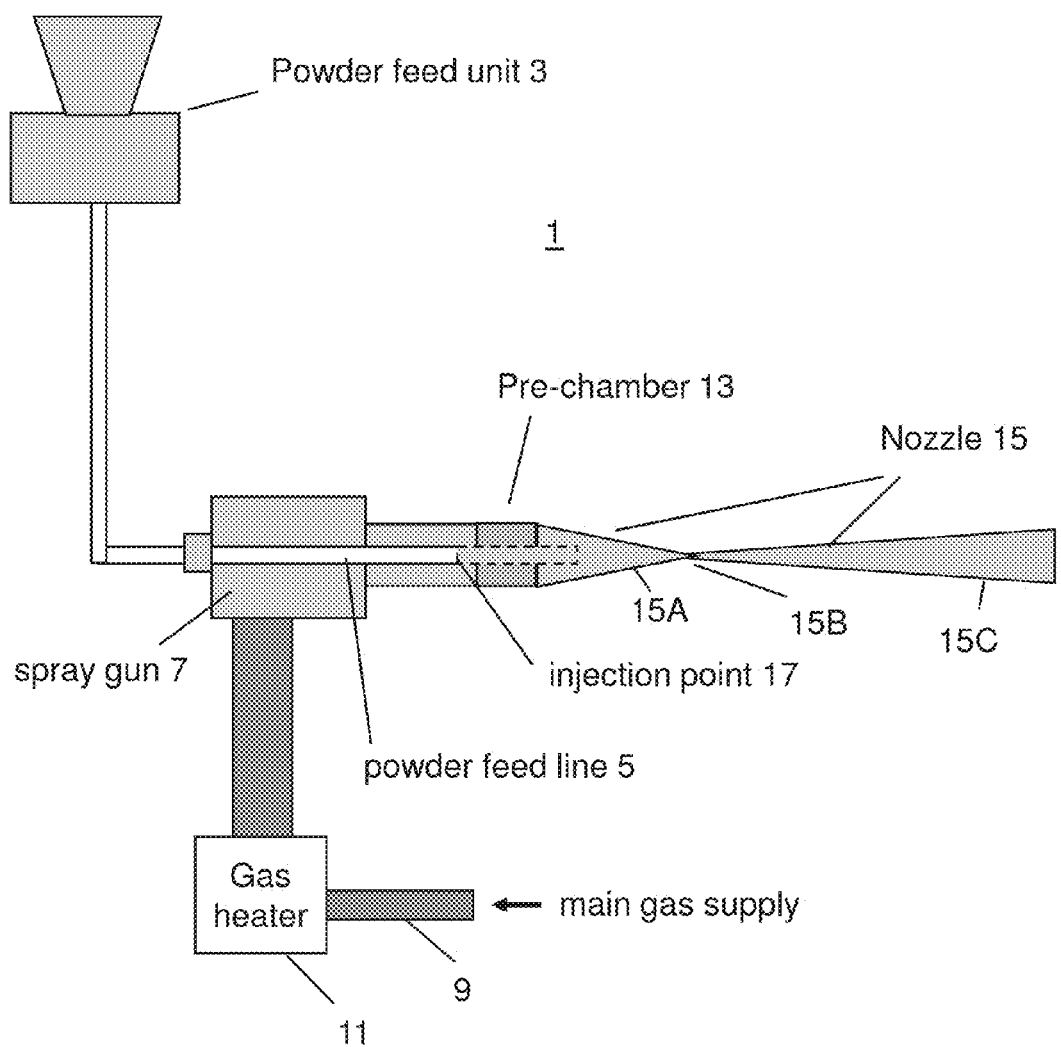
FIGS. 1-6 are side cross sectional views of an exemplary cold spraying apparatus according to embodiments of the invention.

One consideration in selecting and developing sputtering targets is the material to be used in such sputtering targets. Various materials that initially appear to be attractive selections impose manufacturing challenges, particularly from a metallurgical standpoint and particularly when forming the material into a cylindrical or tubular shape. Another consideration is that many monolithic targets formed without a backing tube are not adequate to accommodate water cooling which is provided to the magnets and target assembly during a sputtering operation. Due to this, sputtering materials must often be either bonded to a backing tube or directly formed onto a backing tube, such as a backing tube made from stainless steel or other suitable material.

An exemplary sputtering technique is magnetron sputtering which utilizes magnetrons. Examples of such magnetron sputtering techniques, such as planar magnetron sputtering and rotary magnetron sputtering are discussed in U.S. Pat. No. 7,544,884, issued on Jun. 9, 2009, and which is hereby incorporated by reference in its entirety.

Rotary magnetron sputtering uses cylindrical sputtering targets that include a tube that forms the target material and at least one magnet located inside the tube. Due to the continuous displacement of the magnetic flux lines running through the tube wall as the tube is rotated around the magnets, circumferentially uniform erosion is achieved at the surface of the sputtering target. Such an erosion profile results in higher utilization of the target material in comparison to the erosion profiles provided by other sputtering techniques, such as those employing stationary, planar magnetrons.

One example of a sputtering application is the deposition of materials for solar cells. Copper indium selenide ("CIS") and copper indium gallium selenide ("CIGS") materials have been recognized as effective p-type solar cell absorber layer materials for the production of high efficiency, low cost, and large scale solar cells. Copper indium selenide and copper indium gallium selenide materials may be formed by a reactive sputtering from a copper indium or copper indium gallium ("CIG") sputtering targets, respectively, in a selenium containing ambient, such as selenium gas or hydrogen selenide gas.

CIG alloys possess a large freezing range, with a liquidus temperature over 500° C., often around 650° C., and a solidus temperature of below 160° C. A significant volume change is associated with the solidification and thermal contraction that often occurs over such a wide temperature range. Thus, a substantial amount of shrinkage occurs during solidification of such alloys. Sputtering targets, long in one dimension, having narrow sections and thin walled features, for example, can have porosity due to extensive solidification shrinkage.

Inclusions and structural defects, such as voids and porosity, are detrimental to sputtering processes, because such defects can cause arcing and electrical discharges that result in particle generation and the development of thin film anomalies. Phase heterogeneities, such as large areas of indium or copper, can also be detrimental to the sputtering process, so it is desirable that the target material possess a fine-scale microstructure, which is obtained by employing sufficiently rapid cooling during solidification. In addition, large scale variations of composition within a target can lead to sputtered thin films of variable properties across their area and, as a consequence, reduced yield, so the method of CIG target production must limit the amount of macroscopic segregation of constituent elements.

For example, the embodiments of the present invention provide methods of forming a copper indium gallium ("CIG") alloy sputtering target material. The CIG sputtering target material may be formed directly onto a backing structure, such as a cylindrical backing tube. Alternatively, the backing structure may have a planar shape.

Preferably, the CIG sputtering target material has a composition of about 29-41 wt %, such as 29-39 wt % copper, about 36-62 wt %, such as 49-62 wt % indium, and about 8-25 wt %, such as 8-16 wt % gallium. In another embodiment, the CIG sputtering target material has a composition of about 8-15 wt % copper, about 55-80 wt % indium, and about 10-25 wt % gallium. Preferably, the sputtering target material has an overall uniform composition, whereby the wt % of each of these 3 primary elements, of samples taken from any 2 random locations of the target, as determined by reliable analytical procedures of a material volume of at least 10 $mm^3$, does not vary relatively by more than 10%, and more preferably not more than 5%. Typically the microstructure of CIG consists of a primary, Cu—Ga-rich intermetallic phase in an indium-rich matrix.

The sizes of the primary phase regions are determined using the planimetric technique described in section 12.5 of ASTM standard E1382-97 (2004) and using ASTM E562-08 to calculate volume fraction, in each case substituting primary phase "region" for "grain". Each primary phase "region" is defined as an entity visible in cross section under SEM with discernable boundaries and surrounded by the indium-rich matrix. In some cases, primary phase regions may have visible cracks but no matrix in the crack, in which case this is still counted as a single primary phase region. Preferably, between 0% and 10%, for instance 1% to 5%, of the primary phase regions (each comprising more than about 40 wt % copper) are of size greater than 10 μm in a random 1 cm by 1 cm area of the sputtering target. More preferably, between 0% and 10%, for instance 1% to 5%, of the primary phase regions are of size greater than 5 μm. Preferably, the average size of the primary phase region is no greater than 5 μm. More preferably, the average primary phase region size is 0.1 to 3 μm, such as 0.2 to 2 μm.

Preferably, the CIG sputtering target material has a density of 95% or more, as determined by the rule of mixtures applied to the densities of the component elements. The density determined this way can be greater than 100% due to the formation of an intermetallic compound with greater density than the pure elements. For example, the sputtering target material has a density of about 100 to 107%, such as 102-106%. Preferably, the average level of porosity in the CIG sputtering target material should be 0 to 12 vol %, as determined by microstructural image analysis of representative cross sections, for example. More preferably, the average level of porosity may be 0.1 to 7 vol %, such as 1 to 2 vol %. In addition, the CIG sputtering target material should not contain single inclusions or pores large enough to completely contain a 50 μm diameter sphere, preferably it should not contain single inclusions or pores large enough to completely contain a 20 μm sphere. Inclusions or pores may exceed the preferred maximum size in the near-surface region within about 200 microns of the deposit surface or edges. In other words, single inclusions or pores, if present in the material, are small enough to only contain a sphere of less than 50 μm. Non limiting examples of single inclusions are foreign contaminants and/or oxide particles. In addition, the CIG sputtering target material should contain no pores or cracks having a distance of larger than 500 μm when measured as straight linear distance between ends, more preferably not larger than 200 μm.

The terms "kinetic spray" or "cold spray" process are used interchangeably herein. Thus, the term "cold spray" includes within its scope supersonic cold spray, sonic cold spray and subsonic cold or kinetic spray (also known as kinetic metallization). The cold spray process involves directing a powder loaded gas stream towards a "substrate", such as a sputtering target backing structure to produce a deposit entirely built up from the powder material without significantly melting the powder or otherwise coarsening the powder microstructure. In other words, the metal powder particles preferably remain in the solid state throughout the process from the time the particles are provided into the injection nozzle to the time the particles reach the backing structure. The kinetic compaction process of the powder in the solid state forms a deposited layer on the backing structure.

In one embodiment, the cold spray method is used to form a CIG sputtering target material with no or little segregation of the elements, no or closely controlled contamination with Fe, Cr, and/or Ni, and a low content of oxygen and other contaminants from the atmosphere.

Cold spray powder deposition requires a minimum or so called "critical" powder particle velocity in order to achieve particle bonding and material built up. Depending on the material, a deposit will form when the particles reach a critical velocity for bonding of the particular material. The critical velocity is often defined as the velocity needed for 50% of the powder material feed into the gas to bond to the substrate. The critical velocity is dependent on the material's physical properties. It is calculated that critical velocities of only 100 m/s to 150 m/s can be anticipated for indium as a very soft metal. CIG, in the desired composition described above, is a soft and indium rich material. It is believed that velocities between 150 and 300 m/s can be used to deposit CIG. With the preferred deposition parameters described below, it is believed that the deposit will be very dense with only residual pores or even no pores.

It is generally accepted that the powder particles bond or stick by very localized and rapid heating or welding effects between the particles and the backing structure. The heating/welding is limited to a very localized area between particles and usually cannot be resolved in light microscopy (features well below 1 μm). The overall powder microstructure is preserved. Predominantly kinetic energy is used to form the deposit since the process is non combustive with a high pressure gas stream expanding though a de Laval or straight nozzle. In other words, since the process gas temperatures suitable for deposition of the CIG material of the desired composition range from 40-325° C., and due to the short interaction of powder and gas in the nozzle of the spray system, powder particle melting preferably does not occur and other temperature/time induced micro-structural changes preferably do not happen.

Gas temperature plays an important role to bring the CIG material to a state and temperature favorable for the high velocity impact and deformation. The properties of CIG alloys change considerably from soft and ductile to considerably hard and brittle with increasing copper content. Specific process gas temperatures for favorable deposition conditions can be identified for CIG materials with a copper content above and below 33 wt %. In other words, for the purposes of defining a preferred spray processing regime, low copper CIG (≤33 wt % Cu, such as 8-33 wt % Cu, including 8-15 wt % Cu) can be deposited with process temperatures ranging from room temperature to 150° C. (e.g., 150° C. or below), preferably 40-120° C., including 90-100° C. In contrast, high copper content CIG (>33% wt % Cu, such as 33-41 wt % Cu) can be deposited with process temperatures ranging (i.e., gas heating) between 180 and 325° C., preferably 220-300° C., including 260-270° C.

Figure 10A:
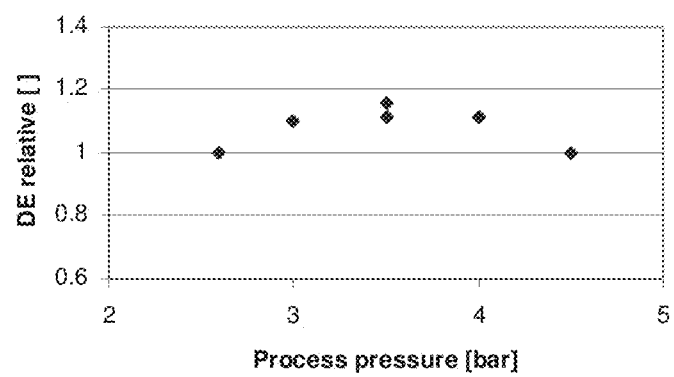
FIG. 10A is a plot of deposition efficiency versus process pressure for an exemplary single high copper CIG composition.
Figure 10B:
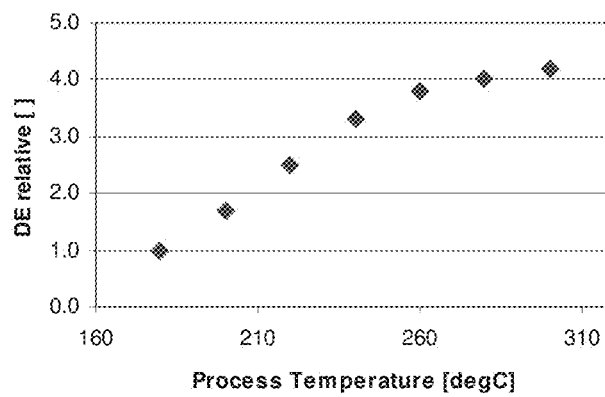
FIG. 10B is a plot of deposition efficiency versus process temperature for an exemplary single high copper CIG composition.

For example, FIG. 10B is a plot of deposition efficiency versus gas temperature in degrees Celsius for a single high Cu CIG composition (37-38 wt % Cu, 52-53 wt %, and 10-11 wt % Ga). The deposition efficiency is measured relative to a baseline efficiency value of 1 at about 180° C. As shown in this figure, the deposition efficiency increases by about two times or more at a temperature above 220° C., and about four times (e.g., to a relative value of about 4) in the 260 to 300° C. range compared to the base line efficiency.

The cold or kinetic spraying to deposit a CIG sputtering target material on a planar or tubular sputtering target backing structure is a net shape process and preferably no machining of the deposited CIG material is needed. The microstructure is uniform, from the first layer deposited up through the thickness to the outer surface, though the porosity in the last deposited layer or layers may be higher than in the bulk. Machining may be used to achieve specific geometrical features in the CIG sputtering target material, such as a greater thickness of the CIG material at both ends of the target tube than in the middle of the tube in order to provide additional CIG material near the top and bottom of the magnetron sputtering target's "race track" where greater wear of the CIG target material occurs.

U.S. Pat. No. 6,722,584, incorporated herein by reference in its entirety, illustrates an exemplary prior art cold spray system. Exemplary high and low pressure cold spray systems which use a supersonic gas stream are available from Centerline of Windsor, Canada (low pressure system) and CGT of Ampfing, Germany (high pressure system). The differences between the two systems are the system pressure, the injection point of the powder particles and the feeding system. High pressure cold spray systems generally operate at a pressure of 2.5 to 4.5 MPa (i.e., 25 to 45 bar), while low pressure systems generally operate at a pressure of 0.4 to 1.03 MPa (i.e., 4 to 10.3 bar). In general, in high pressure systems, powder particles are fed at the nozzle centerline before the nozzle throat section, while in low pressure systems, the powder is injected radially after the throat section. The feeding systems of each cold spray system are based on the largely different system pressures and usually require a high pressure feeding system for the high pressure process.

In CIG deposition, critical particle velocities are considerably low allowing for process pressures below 4 bar. Nozzle designs that provide sufficient flow deliver highest deposition efficiencies in the 0.1 to 3.8 MPa (1-3.8 bar) pressure range, preferably with process pressure between 2.8 and 3.8 bar. For example, FIG. 10A is a plot of deposition efficiency versus process pressure in units of bar for a single CIG composition (37-38 wt % Cu, 52-53 wt %, and 10-11 wt % Ga). The deposition efficiency is measured relative to a baseline efficiency value of 1 at about 2.6 bar. As shown in this figure, the deposition efficiency increases by about 10-18% (e.g., to a relative value of about 1.1 to about 1.18) in the 2.8 to 3.8 bar pressure range compared to a base line efficiency at about 2.6 and 4.6 bar.

A third type of cold spray process, which is often called kinetic metallization or kinetic spray differs from the high and low pressure supersonic cold spray systems in that it uses a subsonic process gas velocity and a subsonic gas nozzle. An exemplary kinetic spray is available from Inovati of Santa Barbara, Calif. The exemplary system available from Inovati may also contain a split path for the helium process gas (where the cold helium leg is routed through the powder fluidizing unit while the hot leg is routed through the thermal conditioning unit (e.g., heater), followed by merging both legs of the process gas in a mixing chamber), triboelectric charging of the metal particles, and fluid dynamically coupled debris recovery nozzles.

FIG. 1 is a schematic illustration of an exemplary cold or kinetic spray deposition system 1. The system 1 includes a powder feed unit 3. The feed unit 3 may include a hopper for receiving the powder and optionally a mechanical feeder, such as screw feeder, or a non-mechanical feeder, such as a fluidized bed. Alternatively, the powder may simply be fed downward by gravity from the hopper if the feed unit 3 is located at a top of the system 1. Preferably, the feed unit has non stick surfaces and pressure on powder is preferably avoided. The system 1 also includes a powder feed line 5, such as a pipe, tube or other conduit which operatively connects the powder feed unit 3 to a spray gun 7. The term "operatively connects" means either a direct or an indirect but functional connection. Any suitable spray gun 7 known in the cold or kinetic spray art may be used.

The system also contains a process gas supply conduit 9, such as a gas inlet pipe or tube. The supply conduit 9 may include a blower if needed. The process gas supply conduit 9 is operatively connected to the spray gun 7. A process gas heater 11, such as a resistive, lamp or other heater type is positioned to heat the process gas in the process gas supply conduit 9. Thus, the heater 11 may be located on, in or around the process gas supply conduit 9 to preheat the process gas to the desired process temperature. If desired, an unheated process gas may be provided into the powder feed unit 3 to assist movement of the powder through the line 5.

An optional pre-chamber or mixing chamber 13 may be located between the spray gun 7 and the nozzle 15. Thus, the nozzle 15 is operatively connected to the spray gun 7. In other words, the nozzle 15 may be directly connected to the spray gun 7 or the nozzle may be indirectly connected to the spray gun in the case where the pre-chamber 13 is located between the spray gun and the nozzle. The nozzle preferably includes a converging bore in an inlet portion and a straight or diverging bore in an outlet portion, as will be described in more detail below.

In the cold spray process, kinetic energy is transferred from a high velocity gas stream to the powder that is used to create the deposit. The gas density rapidly decreases in the standard supersonic nozzles and larger particles and smaller particles have greatly differing exit velocities due to inertia. Residence time of the powder in the gas stream is usually very short, not allowing considerable particle warming or heating.

In one embodiment, the system 1 is designed such that the powder particles have a longer residence time in the heated process gas. This is done by adding the pre-chamber (also referred to as a mixing chamber or powder feed line heating section) 13. The powder feed line 5 and the process gas supply conduit 9 are positioned in the pre-chamber 13 to allow heat transfer between them. Thus, the pre-heated process gas is used to pre-heat the powder in line 5 before the heated gas and the powder are mixed. For example, the process gas supply conduit 9 may be located concentrically around the powder feed line 5 in the pre-chamber 13 as shown in FIG. 1. In other words, the line 5 is located inside the conduit 9. Alternatively, the line 5 and conduit 9 can be located adjacent to each other to allow heat transfer between them (i.e., in direct physical contact or in sufficient proximity to allow convective heat transfer). For example, the line 5 and conduit 9 can share a common wall for heat transfer.

The pre-chamber length may be for example 5-250 mm, such as 25-100 mm or preferably 25-50 mm, and can be optimized based on the process gas, powder material and other process variables to facilitate heating of the powder. The powder feed line 5 extends into (and optionally through) the pre-chamber 13 such that the powder located in the powder feed line 5 is heated by a hot or warm process gas in conduit 9 before the powder is provided into the heated process gas (i.e., before the powder is mixed with any process gas). The pre-chamber 13 is illustrated in FIG. 1 as having a variable length. As shown in FIG. 1, the powder injection point 17 from line 5 can be varied (i.e., point is shown by dashed lines).

Figure 2:
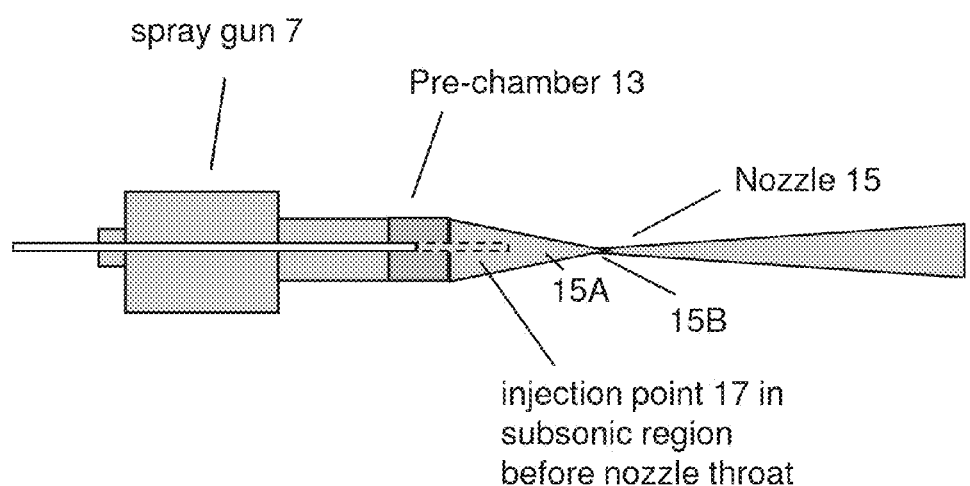

FIGS. 1 and 2 show a de Laval (i.e., converging-diverging type) nozzle 15. This nozzle 15 contains an inlet portion 15A having a converging inner bore, a throat portion 15B having a smallest size or diameter inner bore and an outlet portion 15C having a diverging inner bore. The outside diameter of the nozzle may but does not have to follow the inner bore diameter.

Figure 3:
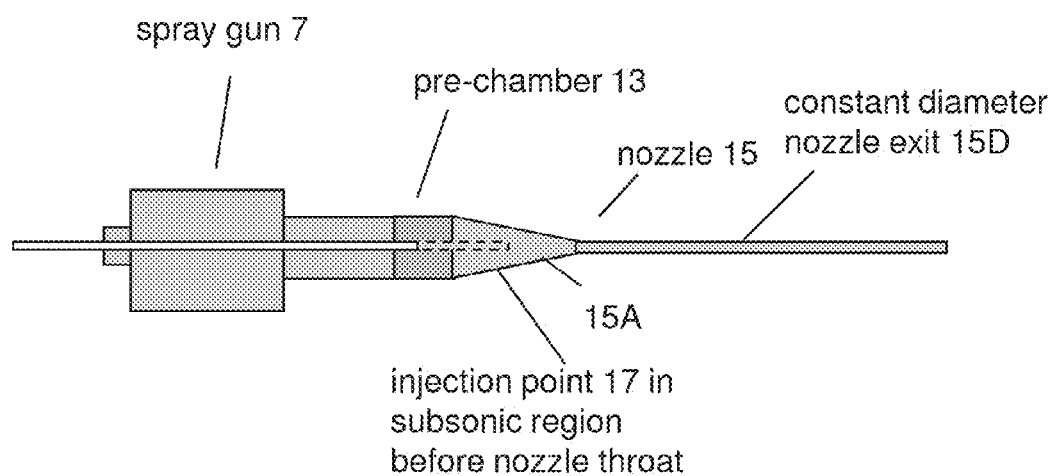

In another embodiment shown in FIG. 3, the nozzle 15 has a straight bore having a substantially constant diameter in the outlet portion 15D. The gas stream may reach supersonic velocities at the exit to the nozzle, but not much greater than mach 1 velocity.

Thus, the nozzle is designed as a straight sonic nozzle. The nozzle continues with fixed diameter inner bore after the end of the convergent intake. Therefore, high gas velocity and considerable gas density can be utilized.

The nozzles shown in FIGS. 2 and 3 have a center feed configuration, where the powder injection from the feed line 5 takes place in the convergent bore inlet part 15A of the nozzles 15. A center feed nozzle has a powder injection point in the subsonic part of the nozzle and the feeding system has to work against the plenum pressure (e.g., 1-20 bar).

Figure 4:
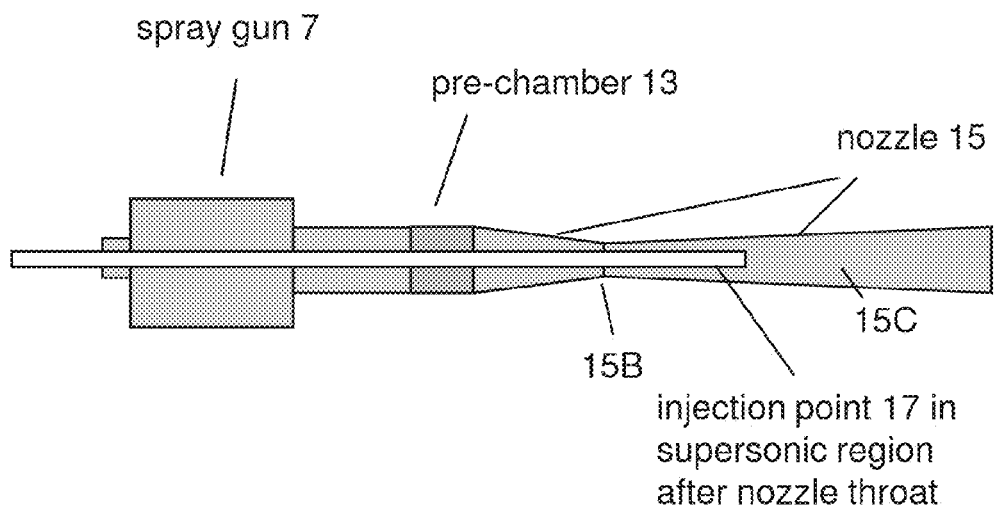
Figure 5:
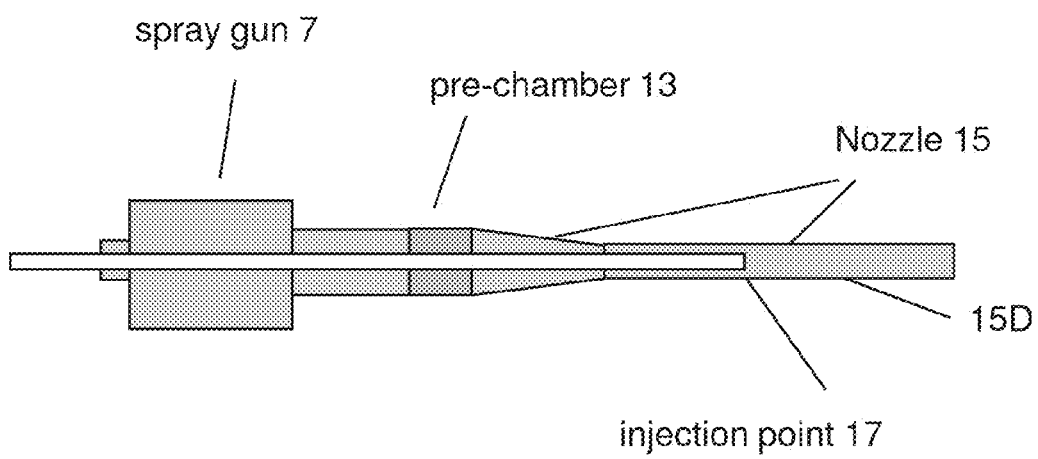

In another embodiment shown in FIGS. 4 and 5, the nozzles 15 have an injector type design, where the powder feed line 5 extends into the outlet portions 15C or 15D of the de Laval or straight nozzles 15, respectively. Thus, the powder is fed into the diverging or the straight portion of the respective nozzle type. The powder enters the process gas after the throat, in the low pressure region so that lower feed pressures can be utilized, facilitating powder feeding and handling. The center feed injector nozzle design allows the powder to be fed into a lower back pressure than typical for high pressure cold spray. The feed system only has to work against the reduced local pressure of the gas stream.

Figure 6:
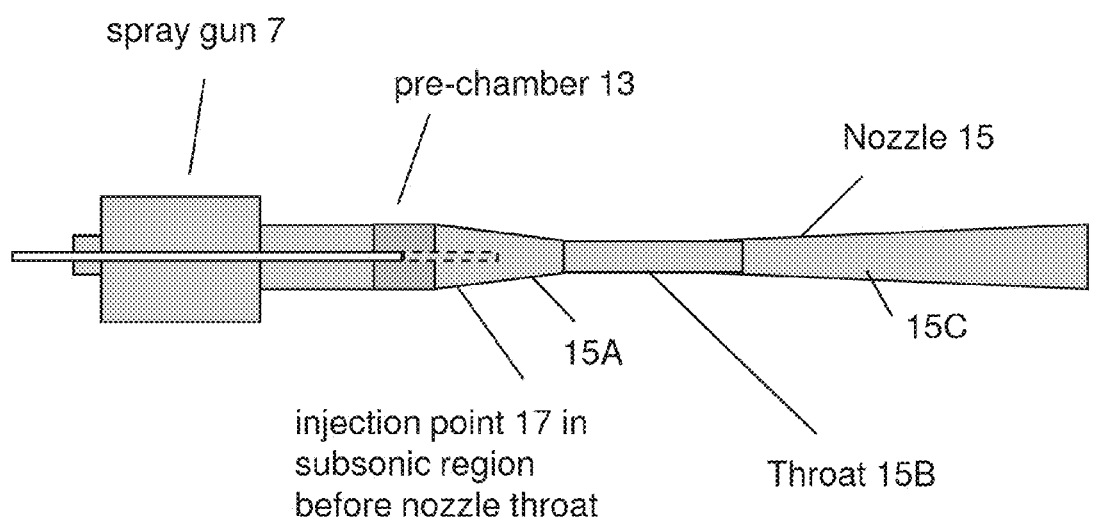

In another embodiment shown in FIG. 6, the de Laval type nozzle 15 has an optimized throat section. The nozzle 15 comprises the converging bore in the inlet portion 15A, the diverging bore in the outlet portion 15C, and a throat portion 15B located between the inlet 15A and the outlet 15C portions. The throat portion 15B has a substantially constant inner diameter bore and a predetermined length. In other words, in contrast to a typical de Laval type nozzle where the throat section is a point where the converging and diverging bores meet, the throat portion 15C has constant inner diameter bore extending along a length of at least 1 mm, such as 1-30 mm, for example 10-25 mm. The throat diameter is continued for the at least 1 mm before a divergent portion begins. High gas density paired with high gas velocity can be utilized to accelerate the particles. The throat section optimized in length allows a powder fraction with a broad particle distribution be accelerated to desired speeds: large particles at minimum speed and small particles at or below maximum speed necessary or allowable for deposition.

FIGS. 1-6 illustrate a feed line 5 having a flat surface (i.e., a surface that is perpendicular to the axis of the line 5) at the injection point 17. Such a configuration is likely to induce heated process gas turbulent flow at the injection point 17.

Figure 7:
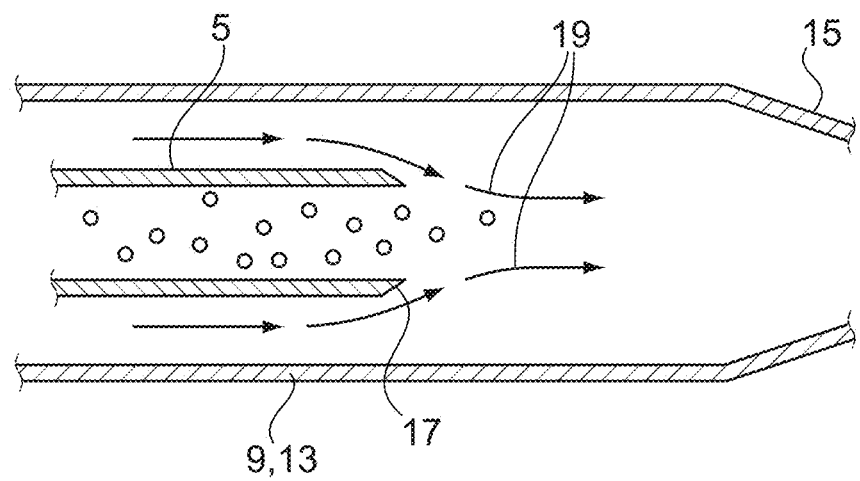
FIG. 7 is a side cross sectional view of a powder feed line tip according to an embodiment of the invention.
Figures 8A, 8B:
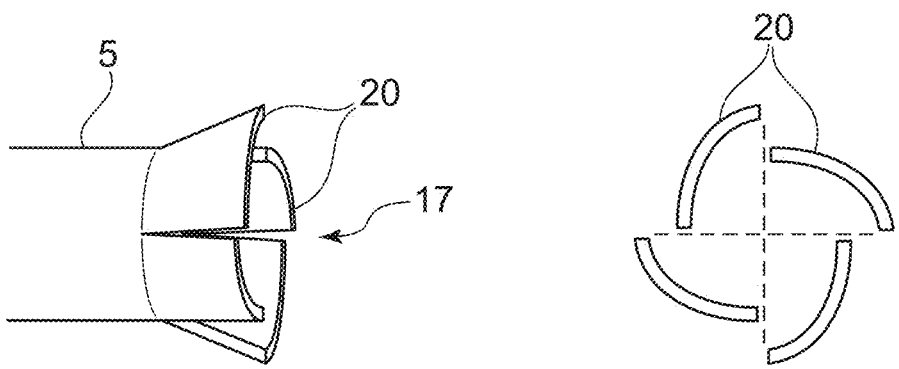
FIG. 8A is a side view and FIG. 8B is a front view of a powder feed line tip according to an embodiment of the invention.
Figure 8:
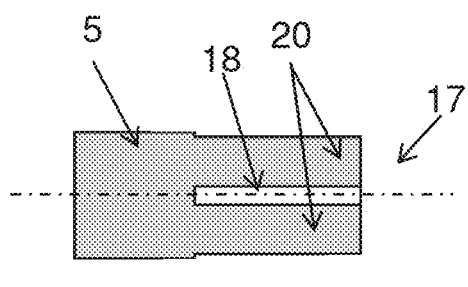
FIG. 8C is a side view and FIG. 8D is a front view of a powder feed line tip according to an alternative embodiment of the invention.
Figure 8:
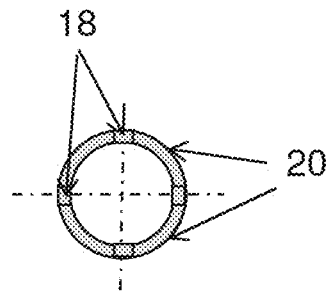

FIG. 7 illustrates an alternative feed line 5 having a tapered surface at the injection point 17. This configuration may be used when a lower turbulence or laminar process gas flow 19 is desired. FIGS. 8A and 8B illustrate another alternative feed line 5 having plural twisted leaves 20 at the injection point 17 to provide an increase in turbulent gas flow. FIGS. 8C and 8D illustrate an alternative configuration of a feed line 5 shaped as slotted feed pipe exit to promote early process gas and feed gas interaction. The line 5 of FIGS. 8C and 8D contains slots 18 separating non-twisted leaves 20 at the injection point 17.

CIG is a very soft material that tends to stick to metal surfaces and the alloy compositions with a copper content below 33% described above have a very low mechanical strength (hardness can be below 10 hardness Knoop for the low Cu CIG alloys and less than 100 hardness Knoop, such as 10-100 hardness Knoop for the high Cu CIG alloys). In one embodiment, non-stick materials, such as Teflon, silicone, polyethylene, polypropylene, etc., are used in interior passageways of the apparatus to assist powder flow. For example, the injector nozzle may comprise a non-stick material, the powder feed line may comprise a non-stick material, and/or the feed unit may comprise a non-stick material on their interior surfaces. Non-stick coated materials other than Teflon, such as electroless plated nickel with Teflon particles embedded, polished ceramic, Delrin, graphite containing plastic, PTFE containing graphite powder or other low friction fillers, etc. may be used alone or in combination.

Thus, in summary, the cold or kinetic spray is based on the high velocity impact of solid powder particles that are injected into a high speed process gas stream. Hence, some of the important process variables include the ones that govern the process gas velocity, particle velocity and particle temperature which will influence mechanical deformation behavior and bonding of the powder. Such process variables (which may be linked or interdependent) include system process gas pressure, process gas temperature, process gas composition, powder feed rate, powder size and density, and nozzle geometry.

As noted above, since CIG is a very soft material that tends to stick to metal surfaces and the alloy compositions described above have a very low mechanical strength, the embodiments of the invention adapt the cold spray process for this CIG material because traditionally metals with higher mechanical strength, hardness and melting point, such as pure copper or aluminum, iron based materials and Al, Fe and Cu alloys, are deposited by cold spraying.

To achieve bonding/sticking of the CIG material, the process parameters are adapted so that sufficient impact heating but no excessive heating is attained in the bonding interface of particle to the backing structure or particle to particle. The generally applied "rule" in cold spray of "more velocity is good" (up to the point where erosion effects are observed) does not yield good bonding or deposition with CIG. Particle velocities during impact that are above a specific threshold will most likely cause extensive heating and may be even melting in a thin contact region between impacting particle and backing structure (or the already deposited material). In this case, bonding cannot occur since particles can not bond.

Thus, in some embodiments of the invention, the process window is selected to be below common cold spray process pressures and temperatures of high and low pressure cold spray (20-30 bar or 4 to 10 bar and 250-600° C.) i.e., below the so called upper threshold. At the same time particle velocities have to be above a lower threshold that is defined by a critical velocity necessary for bonding or acceptable porosity in the deposit. Typical lower threshold values are 1-2.5 bar and room temperature (no heating).

Powder particle size is an important factor for particle velocities that can be achieved as well as upper threshold values. It is generally understood that larger particles with the same particle velocity develop higher impact heating than smaller particles.

Substrate rotation and nozzle translation velocity are preferably chosen to achieve complete coverage of the surface and minimize local heating. Substrate rotation is preferably 200-800 rpm, more preferably 400-600 rpm to match a nozzle translation of 180-1200 mm per minute, more preferably 360-660 mm/min. The kinematic variables have a positive influence on deposition efficiency with an upper limit for translation speeds defined by the width of the spray beam and the need to avoid spiral patterns on the surface.

The powder for the cold or kinetic spray process is selected from at least one of the following powders. In one embodiment, the powder may be a pre-alloyed or mechanically alloyed copper indium gallium powder (i.e., a CIG alloy powder having a composition of about 29-41, such as 29-39 wt % copper, about 36-66, such as 49-62 wt % indium, and about 8-25, such as 8-16 wt % gallium, or a CIG alloy powder having a composition of about 8-15 wt % copper, about 55-80 wt % indium, and about 10-25 wt % gallium). In another embodiment, the powder is a mixed powder blend of elemental copper, elemental indium and elemental gallium powders having the above weight percent distribution. In another embodiment, the powder is a mixed powder blend of elemental, binary alloy or ternary alloy powders comprising copper, indium and gallium selected to deposit a CIG sputtering target having a composition of about 29-41, such as 29-39 wt % copper, about 36-66, such as 49-62 wt % indium, and about 8-25, such as 8-16 wt % gallium on a backing structure, or a CIG alloy powder having a composition of about 8-15 wt % copper, about 55-80 wt % indium, and about 10-25 wt % gallium on the backing structure. In another embodiment, the powder comprises separate elemental or alloy powders comprising copper, indium and gallium which are simultaneously but separately fed from separate powder reservoirs into the process gas to deposit a CIG sputtering target having a composition of about 29-39 wt % copper, about 49-62 wt % indium, and about 8-16 wt % gallium on the backing structure. Thus, the CIG alloy may be formed as a CIG alloy powder provided into the process gas or it may be formed upon deposition on the backing structure from Cu, In and/or Ga containing powders.

In one optional embodiment, water or another oxidizing medium is provided to form a metal oxide coating on the particles, preferably during the atomization process of the powder. This step occurs before providing the process gas stream containing the powder from a nozzle onto the backing structure.

Preferably, the average particle size of the powder is at least 35 µm. For example, the average particle size of the powder is 50 µm, more preferably 65 µm, and at least 80%, such as at least 90% of the powder particle sizes range from 35 µm to 150 µm. In other words, only 20% or less, such as 10% or less of the powder may have a size below 35 µm or above 150 µm. Thus, a relatively coarse powder particle size and size distribution that can be accelerated sufficiently in the process gas stream is provided. The desired powder size distribution achieves high deposition efficiencies (i.e., powder material deposited vs. material introduced in process). The powder(s) is coarse enough to tightly control contamination from the atmosphere and fine enough to achieve minimum velocities needed in the process. In contrast, in the prior art cold spray processes, it is generally accepted that coarser particles have a lower critical velocity than finer particles. It can be attributed to the higher kinetic energy of a coarser particle at the same velocity. For example, prior art cold spray processes typically use particle size of <45 µm or 45-75 µm powders for soft low melting point materials. Optimal powder particle size distribution is dependent on chemical composition of the powder. For high copper content CIG (e.g., above 33 wt % Cu), an upper sieve cut preferably at 125 microns, more preferably at 90 microns yields highest deposition efficiency. Due to its soft nature, for the low copper content CIG (e.g., below 33 wt %) an upper sieve cut preferably at 180 microns, more preferably at 150 microns is possible to increase overall powder utilization at similar deposition efficiencies. Sieved powders usually include considerable amounts of powder particles smaller than the lower sieve cut, typically 10-20%, and up to 5% of powder particles greater than the upper sieve cut.

Using coarser powder will be an advantage provided sufficient powder acceleration is achieved. Coarse powders allow high deposition rates and reduced process time, high yield in powder atomization, high deposition efficiency and efficient reclaim of material lost in the process chain. Both spherical and irregular shaped particle powders may be used.

In another optional embodiment, the powder includes other elements in addition to Cu, In and Ga. For example, the CIG alloy powder may be preallyed with Se such that it contains 0.01 wt % to 10 wt % Se, for example 0.01 wt % to 0.5 wt %. In another example, the CIG alloy powder particles are coated with a layer of material that is mechanically harder than the CIG alloy, such as a Se or Se compound or alloy material. For example, the CIG alloy powder particles may be coated with a Se and/or CIGS shell. This can be accomplished by exposing the CIG powder to a Se containing gas during or after powder manufacturing, such as in a fluidized bed. Other alloying elements, such as Na, S, and/or Al may also be added to the CIG powder and/or to the elemental or binary alloy precursor powders. For example, the CIG powder may comprise a Na-containing material such that it contains 0.01 wt % to 10 wt % Na, for example 0.1 wt % to 1.0 wt %. The sodium-containing material may comprise any material containing sodium, for example metallic sodium or alloys or compounds of sodium with one or more of selenium, sulfur, oxygen, nitrogen or bather metal (such as molybdenum, tungsten, tantalum, vanadium, titanium, niobium or zirconium), such as sodium fluoride, sodium molybdate, sodium fluoride, sodium selenide, sodium hydroxide, sodium oxide, sodium sulfate, sodium tungstate, sodium selenate, sodium selenite, sodium sulfide, sodium sulfite, sodium titanate, sodium metavanadate, sodium orthovanadate, or combinations thereof. Alloys or compounds of lithium and/or potassium may be also used, for example but not limited to alloys or compounds of lithium or potassium with one or more of selenium, sulfur, oxygen, nitrogen, molybdenum, tungsten, tantalum, vanadium, titanium, niobium or zirconium. The sodium-containing material may be preallyed as part of the powder or provided separately as a separate powder, mixed with the CIG powder and sprayed together. Alternatively, the CIG powder may be sprayed separately from the Na-containing powder, for example using different process parameters (e.g. gas temperature, pressure), on to the same substrate, either simultaneously or alternately. Preferably the resulting deposit contains 0.01 wt % to 10 wt % Na, for example 0.1 wt % to 1.0 wt %.

The process gas may comprise nitrogen, air, a noble gas, such as helium and/or argon, or mixtures thereof. The velocity of the process gas stream is preferably greater than 150 m/s and less than 500 m/s. For example, the velocity of the process gas stream may be 200 to 380 m/s. The CIG powder does not require maximum velocity for deposition, but only a sufficient velocity of all powder particles in the powder fraction, coarse and fine. The nozzle provides this acceleration and both supersonic and subsonic nozzle designs are suitable if adjusted in respect to throat, length and diameter of nozzle, as described above.

The spray distance equally impacts time of flight and thus allows adjusting particle velocity and temperature simultaneously with high particle temperatures at a low spray distance and considerable particle acceleration after the nozzle exit yielding higher particle velocities for large particles in a 75-125 mm inch spray distance. Preferably the spray distance for CIG materials is 80-150 mm, more preferably 90-130 mm.

Preferably, the process gas pressure is 20 bar or less, such as 1 to 3.8 bar. The process gas at the nozzle exit preferably has a mach number of 1 to 2.3, such as 1.1 to 1.8. The powder may be provided into the process gas stream at a rate of at least 60 g/min, preferably at least 100 g/min, such as 60-180 g/min, for example 80-120 g/m. At the same time the gas flow resulting from the process parameters p and T has to be sufficient to limit gas flow mass loading to 60-110 g/m$^3$, preferably 75-95 g/m$^3$. The nozzle design has to ensure that the loading of the gas stream is in that range achieved by the scaling of the throat diameter of the nozzle. Thus, the feed rate is adjusted in a way that desired CIG deposit properties are achieved. The deposition efficiency is high and process time is acceptable. In contrast, a typical prior art feed rate is around 50 g/min and below.

Figure 9:
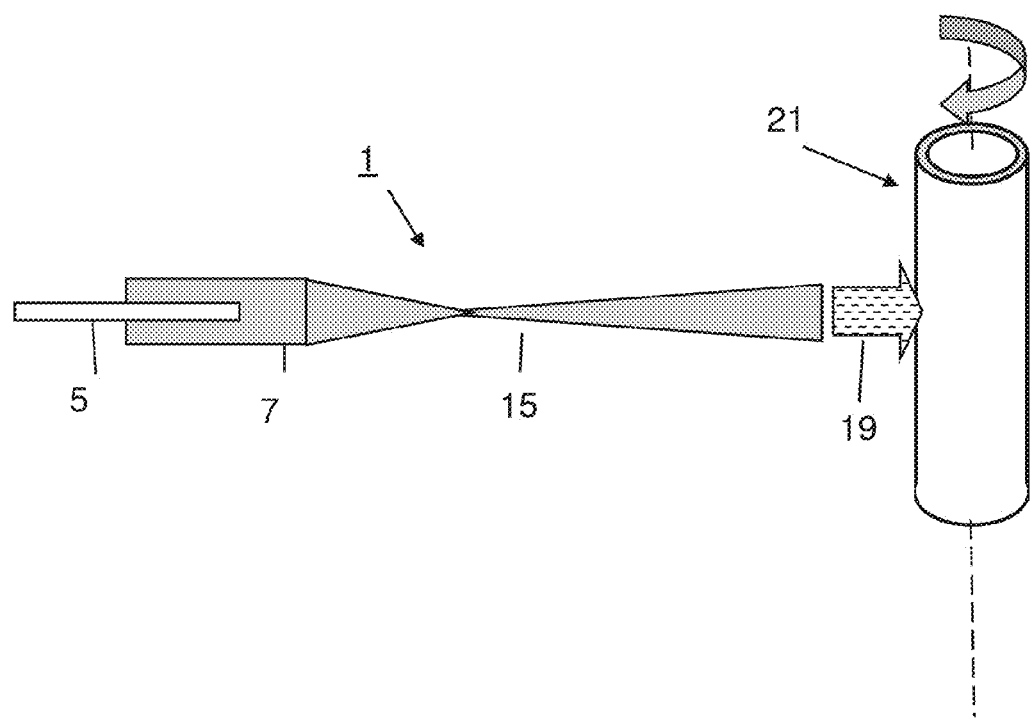
FIG. 9 is side cross sectional view of an exemplary cold spraying method of a tubular sputtering target backing structure, according to an embodiment of the invention.

FIG. 9 illustrates a typical cold spray process set up. The system 1 provides a high velocity process gas stream 19 containing entrained powder from the nozzle 15 onto the backing structure 21. The tubular backing structure 21 shown in FIG. 9 preferably rotates about its axis during deposition, as shown by the arrow.

Exemplary cold spray process steps will now be described. The process can be started by cleaning/degreasing of the backing structure 21. The backing structure can be made out of stainless steel or other suitable materials, including non-ferrous materials such as aluminum.

Initial bonding of the CIG deposit may achieved by roughening the backing structure tube 21 in situ. Optionally, tube 21 ends or other features that should not be roughened in blasting are masked. If desired, bond coats, such as CuAl bronze, may be deposited, for example with the cold spray system, prior to CIG material deposition and/or the tube 21 is roughened by grit blasting or spraying with fine ceramic or hard metallic powder followed by cleaning its surface of dust.

The tube 21 is then placed in a lathe or another rotation device. The powder is prepared, weighed and tumble mixed to thoroughly blend powder particles of different size and potentially different compositions. The powder feeding unit 3 is then filled with the powder. The spray system and the robot or x-y manipulator that moves the nozzle 15 along the tube 21 axis parameters are set. When a desired process set point is reached, powder feeding and robot and tube motion are initiated. The target material is then deposited on the tube to a desired thickness. Spraying can be done while the tube 21 rotation axis is vertical or horizontal or any direction in between. The process may be paused to clean or refill powder feed unit and to verify CIG material built up.

In one embodiment, a specific surface structure is deposited at the end of the spray process. For example, an additional CIG deposited built up at the ends of the backing tube (e.g., a "dog bone" target thickness profile) or in the middle of the backing tube. Preferably the additional build up is achieved controlling the nozzle translation with more material building up in areas with reduced speed of the nozzle.

The process is then shut down followed by blowing off any dust with air. If desired, optional machining of the CIG deposit may be used to provide desired surface condition or to build specific edge design.

The process is run in a noise/dust enclosure. A clam shell or other exhaust hood may be used to suck the air and dust away from the target. Optionally, the CIG material that is not deposited is captured and reused. The captured material is preferably mixed/blended with the newly prepared powder feedstock.

According to another example, the cold spray method described herein can be used to make a planar sputtering target. For example, a flat backing support assembly can be provided to support a planar backing structure rather than a backing tube, with the CIG powder being applied to a surface of the supported planar backing structure.

Figure 11:
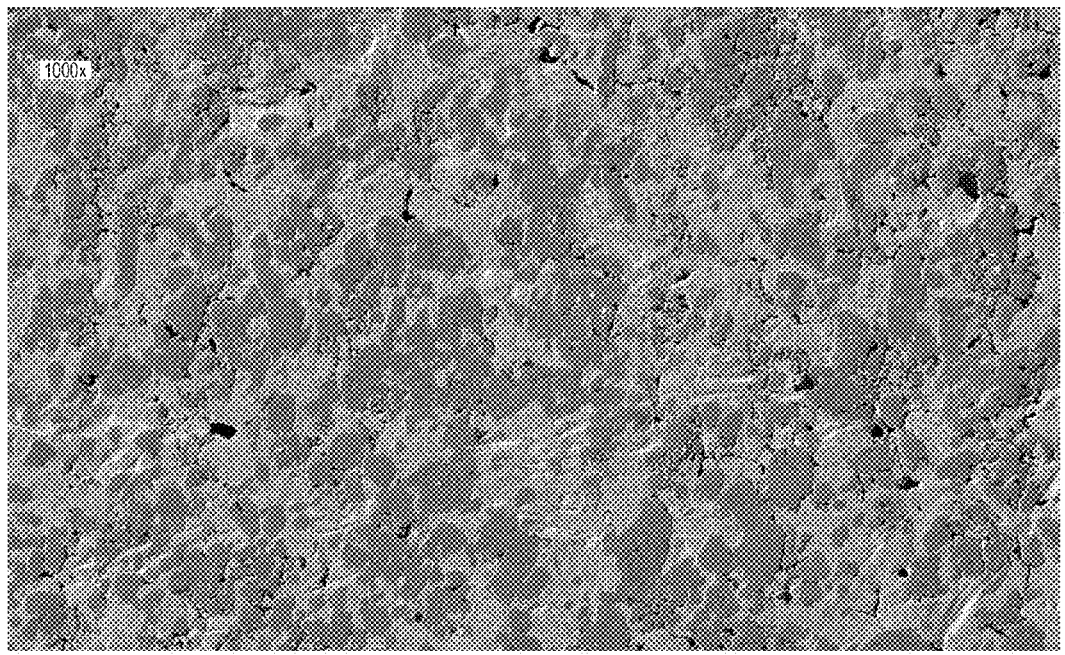
FIG. 11 is a micrograph of an exemplary low copper CIG composition made by cold spraying.
Figure 12A:
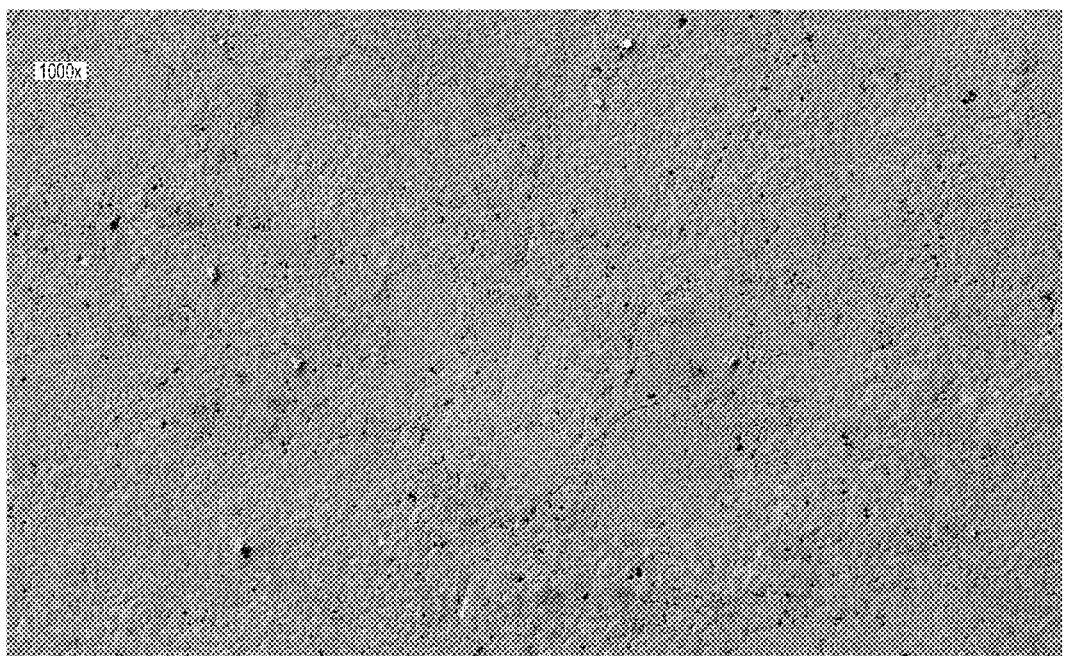
FIGS. 12A and 12B are micrographs of an exemplary high copper CIG composition made by cold spraying.
Figure 12B:
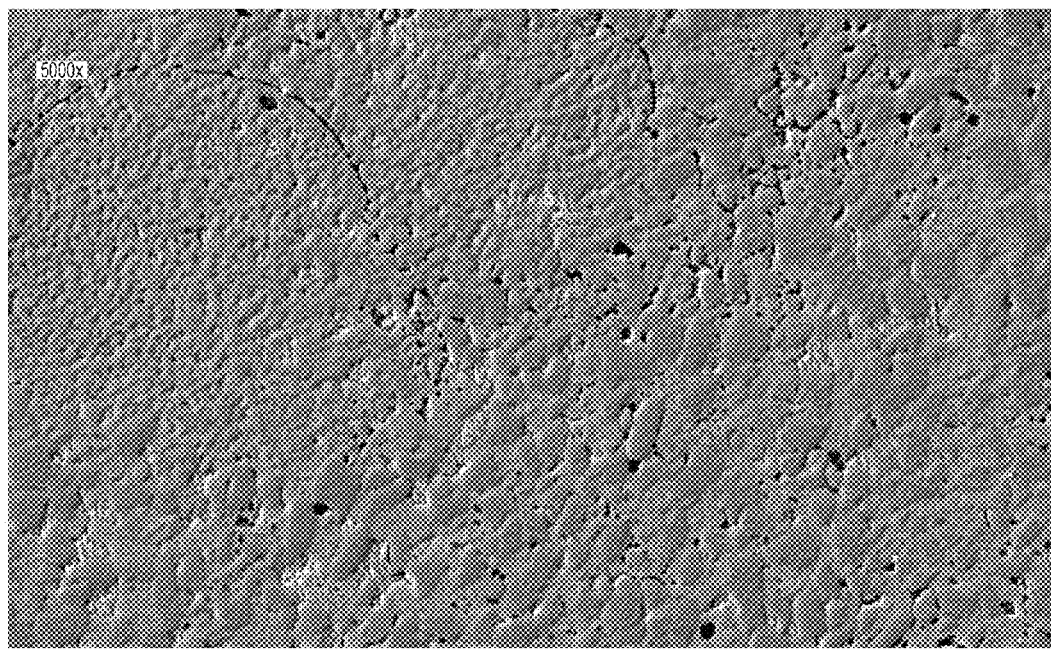

FIG. 11 is a micrograph (1000 times magnification) of an exemplary low copper CIG composition (8-9 wt % Cu, 72-73 wt %, and 18-19 wt % Ga) made by cold spraying. The micrograph shows a $Ga_2Cu$ primary phase in an indium rich matrix. FIGS. 12A and 12B are micrographs (1000 and 5000 times magnification, respectively) of an exemplary high copper CIG composition (37-38 wt % Cu, 52-53 wt %, and 10-11 wt % Ga) made by cold spraying. The micrograph shows a $Cu_9(In,Ga)_4$ primary phase in an indium rich matrix.

While a pure CIG alloy is described above, it should be noted that the CIG alloy may contain other alloying elements. For example, the alloy may contain Na, Al and/or Se in addition to copper, indium and gallium.

It is to be understood that the present invention is not limited to the embodiment(s) and the example(s) described above and illustrated herein, but encompasses any and all variations falling within the scope of the appended claims.

The invention claimed is:

1. A cold spray deposition system, comprising:
   a powder feed unit;
   a spray gun;
   a powder feed line operatively connecting the powder feed unit to the spray gun;
   a nozzle operatively connected to the spray gun, the nozzle comprising a converging bore in an inlet portion and a straight or diverging bore in an outlet portion;
   a process gas supply conduit operatively connected to the spray gun;
   a process gas heater positioned to heat the process gas in the process gas supply conduit; and
   further comprising at least one of:
   (a) the nozzle comprises the straight bore having a substantially constant diameter in the outlet portion;
   (b) the powder feed line extends into the outlet portion of the nozzle; or
   (c) the nozzle comprises the converging bore in the inlet portion, the diverging bore in the outlet portion, and a throat portion located between the inlet and the outlet portions, the throat portion having a substantially constant inner diameter bore and a predetermined length.

2. An apparatus as claimed in claim 1, wherein a pre-chamber is located between the spray gun and the nozzle and the powder feed line extends into the pre-chamber such that the powder located in a powder feed line is heated by the heated process gas before the powder is provided into the heated process gas.

3. An apparatus as claimed in claim 1, wherein a portion of the powder feed line is located in a bore of a portion of the process gas supply conduit.

4. An apparatus as claimed in claim 1, wherein the nozzle comprises the straight bore having the substantially constant diameter in the outlet portion.

5. An apparatus as claimed in claim 1, wherein the powder feed line extends into the outlet portion of the nozzle.

6. An apparatus as claimed in claim 1, wherein the nozzle comprises the converging bore in the inlet portion, the diverging bore in the outlet portion, and a throat portion located between the inlet and the outlet portions, the throat portion having a substantially constant inner diameter bore and a predetermined length.

7. An apparatus as claimed in claim 6, wherein the inner diameter and the length of the throat portion are selected such that the powder is accelerated through the nozzle such that larger size particles reach at least a minimum speed and smaller particles reach a speed below a maximum speeds allowable for deposition of the powder.

8. An apparatus as claimed in claim 1, comprising:
(a) a pre-chamber located between the spray gun and the nozzle, wherein the powder feed line extends into the pre-chamber such that the powder located in the powder feed line is heated by a heated process gas before the powder is provided into the heated process gas; and
(c) the powder feed line extends into the outlet portion of the nozzle; and
at least one of:
(b) the nozzle comprises the straight bore having the substantially constant diameter in the outlet portion; or
(d) the nozzle comprises the converging bore in the inlet portion, the diverging bore in the outlet portion, and the throat portion located between the inlet and the outlet portions, the throat portion having a substantially constant inner diameter bore and the predetermined length.

* * * * *